United States Patent
Berthoud et al.

(10) Patent No.: US 7,656,241 B2
(45) Date of Patent: Feb. 2, 2010

(54) OPTICAL PUMPING DEVICE AND METHOD

(75) Inventors: Patrick Berthoud, Cressier (CH); Pierre Thomann, Fontainemelon (CH)

(73) Assignee: CSEM Centre Suisse d'Electronique et de Microtechniques SA — Recherche et Développement, Neuchâtel (CH)

(*) Notice: Subject to any disclaimer, the term of this patent is extended or adjusted under 35 U.S.C. 154(b) by 217 days.

(21) Appl. No.: 11/816,137

(22) PCT Filed: Feb. 6, 2006

(86) PCT No.: PCT/EP2006/050672

§ 371 (c)(1),
(2), (4) Date: Aug. 13, 2007

(87) PCT Pub. No.: WO2006/084829

PCT Pub. Date: Aug. 17, 2006

(65) Prior Publication Data

US 2008/0157887 A1    Jul. 3, 2008

(30) Foreign Application Priority Data

Feb. 14, 2005   (EP) ................................. 05405189

(51) Int. Cl.
*H03L 7/26* (2006.01)
*H03B 17/00* (2006.01)
*H01S 1/06* (2006.01)

(52) U.S. Cl. .............................. 331/94.1; 331/3; 372/70
(58) Field of Classification Search ..................... 331/3, 331/94.1; 372/70–72
See application file for complete search history.

(56) References Cited

U.S. PATENT DOCUMENTS

| | | | | |
|---|---|---|---|---|
| 5,345,331 | A * | 9/1994 | Bergano et al. | 359/341.31 |
| 6,163,636 | A * | 12/2000 | Stentz et al. | 385/24 |
| 6,433,921 | B1 * | 8/2002 | Wu et al. | 359/334 |
| 6,537,829 | B1 * | 3/2003 | Zarling et al. | 436/514 |

OTHER PUBLICATIONS

International Search Report PCT/EP2006/050672 related to subject application.
European Search Report EP05405189 related to subject application.
Jon H. Shirley and R.E. Drullnger "Zeeman Coherences and Dark States in Optically Pumped Cesium Frequency Standards" Precision Electromagnetic Measurements, 1994. Digest., 1994 Conference on Boulder, CO, USA Jun. 27-Jul. 1, 1994, New York NY, USA, IEEE, Jun. 27, 1994, pp. 150-151, XP010123851 ISBN: 0-7803-1984-2 cite dans la demande le document en entier.

(Continued)

*Primary Examiner*—Robert Pascal
*Assistant Examiner*—Levi Gannon
(74) *Attorney, Agent, or Firm*—Townsend M. Belser, Jr.; Nexsen Pruet, LLC

(57) ABSTRACT

A method for optical pumping of particles and a device for implementing same. The particles (14) are changed from one long lifetime level to another long lifetime level via a short lifetime level by means of interaction with light radiation (16) emitted by a laser source. Prior to this interaction, the light radiation undergoes depolarization in a direction that is essentially perpendicular to the direction of propagation thereof, so as to reduce the entrapment of particles (14) in the black state.

25 Claims, 4 Drawing Sheets

OTHER PUBLICATIONS

Dimarcq et al. (IEEE Transactions on Instrumentation and Measurement, Analysis of the Noise Sources in an Optically Pumped Cesium Beam Resonator vol. 42 (2), Apr. 1993, pp. 115-120).

Article of Giordano et al. (IEEE Transactions on Ultrasonics, Ferroelectrics, and Frequency Control, New Design for a High Performance Optically Pumped Cesium Beam Tube 38 (4), Jul. 1991, pp. 350-357).

Article of Dimarcq et al. (Journal of Applied Physics Comparison of Pumping a Cesium Beam Tube With D1 and D2 Lines, 69 (3), Feb. 1991, pp. 1158-1162).

* cited by examiner

OPTICAL PUMPING DEVICE AND METHOD

BACKGROUND OF THE INVENTION

1) Field of the Invention

The invention relates to a method for optical pumping of a set of particles such as atoms, ions, molecules or other particles, with which formation of black states may be avoided. It also relates to a device for applying this method.

The invention finds interesting applications in atomic resonators and generally in all the instruments which use a source of particles and at least one laser beam capable of performing optical pumping of these particles. A particularly representative application is the atomic clock with an optically pumped cesium jet, the principle of operation of which is described later on. However, this example would not be able to limit the scope of the invention.

2) Description of Related Art

A particle may be characterized from the energy point of view, by discrete levels with a variable lifetime. FIG. 1 in a simplified way, schematically shows a representation of a particle having a level A, a level B and a level E. The lifetimes of levels A and B are long relatively to the time for optical pumping, a notion to be explained in the following, which itself is long relatively to the lifetime of level E.

As illustrated by FIG. 2, in the case of a cesium atom $^{133}Cs$, level A corresponds to the hyperfine fundamental state ($6^2S_{1/2}$, F=3), level B corresponds to the hyperfine fundamental state ($6^2S_{1/2}$, F=4) and level E for example corresponds to the hyperfine excited state ($6^2P_{3/2}$, F=4). Further, in this case, each level is degenerate into sub-levels (also called Zeeman sub-levels), respectively designated by ($6^2S_{1/2}$; F=3; $m_F$=−3, −2, . . . , +2, +3) and ($6^2S_{1/2}$; F=4; $m_F$=−4, −3, . . . , +3, +4) for both fundamental levels, and ($6^2P_{3/2}$; F=4; $m_F$=−4, −3, . . . , +3, +4) for the excited level.

By optical pumping is meant the method by which a fraction or the totality of the particles filling a level A (also called the population) may be transferred to a level B, or vice versa, by means of an interaction between light and the particles. The optical pumping time is defined as the time required for transferring by this method, particles from A to B, or vice versa. In the case of the $^{133}Cs$ atom, the hyperfine optical pumping method is further distinguished from Zeeman optical pumping. Hyperfine optical pumping depopulates one of the fundamental levels ($6^2S_{1/2}$, F=3) or ($6^2S_{1/2}$; F=4) to the benefit of the other one by an optical interaction via the excited state ($6^2P_{3/2}$, F=4) for example, no distinction being made between the Zeeman sub-levels. Zeeman optical pumping depopulates certain Zeeman sub-levels to the benefit of a single sub-level or a superposition of Zeeman sub-levels of a fundamental hyperfine level, by one or more optical interactions via one or more excited states.

Experimentally, in the case of the $^{133}Cs$ atom, hyperfine optical pumping is achieved by illuminating a collection a particles (as a jet or a cell) with an optical beam emitted by a discharge lamp or a laser, with a frequency corresponding to one or more allowed optical transitions between a fundamental level ($6^2S_{1/2}$; F=3) or ($6^2S_{1/2}$, F=4) and one more excited levels, for example ($6^2P_{3/2}$, F=4). With polarized light emitted by a laser, coherences may appear between the Zeeman sub-levels of the fundamental level coupled to the laser, giving rise to so-called "black" states, i.e., transparent to the hyperfine optical pumping process. Dimarcq et al. (IEEE Transactions on Instrumentation and Measurement, 42 (2), April 1993, 115-120) have demonstrated on an experiment with an atomic cesium jet pumped by a laser, that the noise added by the residual fraction of atoms trapped in the black states may considerably reduce the atomic signal-to-noise ratio and therefore become detrimental to the performance of an atomic resonator.

The basic structure of an atomic clock with an optically pumped cesium jet is illustrated by FIG. 3. A source 10 positioned inside a high vacuum chamber 12, produces a fast or slow atomic cesium jet 14. A fast jet is for example generated by an oven, whereas a slow jet is produced by a source of atoms slowed down or cooled by laser. A first so-called 'preparation' laser beam 16, crossing the atomic jet 14 at the outlet of the source 10, achieves the inversion of population required between both fundamental hyperfine states by a hyperfine or Zeeman optical pumping process. The atoms of the jet 14 then undergo a transition between both fundamental hyperfine states in a resonant cavity 18 injected with a microwave from a local oscillator 20. A second so-called 'query' laser beam 22, crossing the atomic jet 14 at the outlet of the resonant cavity 18 detects by a hyperfine or Zeeman optical pumping process, the atoms which have constructively undergone the microwave transition. A detector 24, located facing the query area of the atomic jet 14, collects the fluorescence light re-emitted by the atoms having undergone the optical pumping processes. The intensity of this light signal gives information on the frequency tuning between the microwave injected into the resonant cavity and the atomic transition between both fundamental levels. The signal from the detector 24 further provides servo-control of the microwave frequency of the local oscillator 20, by an adequate system. Both preparation 16 and query 22 optical beams may stem from a single source or multiple sources. They may further result from a superposition of several optical beams with different frequencies.

As mentioned earlier, the signal-to-noise ratio of the fluorescence light in the query area, which conditions the frequency stability performance of the atomic resonator, is degraded by the presence of atoms trapped in black states. Several solutions for suppressing them already exist but they all have a certain number of drawbacks.

A first possibility described in an article of Giordano et al. (IEEE Transactions on Ultrasonics, Ferroelectrics, and Frequency Control, 38 (4), July 1991, 350-357) consists of establishing an intense static magnetic field (larger than 300 mG) with an adequate orientation, i.e., perpendicular to the axis of polarization in the case of linear polarization of laser beams (16, 22) in both regions of hyperfine optical pumping. This has the effect of redistributing the Zeeman populations inside each fundamental hyperfine level, and therefore destroying the black states. This solution, although effective, proves to be difficult and complex to apply because of the requirement of several contiguous magnetic field areas with very different intensities (ten times weaker between the pumping areas than in the latter).

A second solution, described in an article of Dimarcq et al. (Journal of Applied Physics 69 (3), February 1991, 1158-1162), consists of selecting an optical pumping transition which does not create any black states such as for example the 3–4π (D1) transition at 894 nm for the $^{133}Cs$ atom. Unfortunately, the selection of such a transition strongly reduces the degrees of freedom for optimizing other parameters (hyperfine optical pumping efficiency and fluorescence rate). Further, the availability of performing laser sources at these wavelengths is not guaranteed.

A third solution, described in the article of Shirley et al. (Proceedings of the 1994 IEEE Precision on Electromagnetic Measurements, 150-151), consists of perturbing the polarization of the laser beam, at the origin of the trapping of the atoms in the 'black states'. As illustrated by FIG. 4, in which the preparation area is greatly enlarged, this perturbation is produced by creating an optical stationary wave having a polarization gradient substantially parallel to the direction of propagation of the laser beam 16. The stationary wave is produced by retro-reflecting the linearly polarized laser beam 16, by means of a plane mirror 26 located on the path of the laser beam 16, downstream from the pumping area. The longitudinal periodical polarization gradient 28 is achieved by inserting a quarter-wave plate 30 between the plane mirror 26 and the atomic jet 14. In such a stationary wave, polarization changes significantly every quarter wavelength of optical wavelength (0.2 μm for $^{133}$Cs). This solution, certainly elegant, nevertheless has the drawback of introducing two additional optical components with respect to the standard configuration. Further, it is not totally effective if the polarization gradient is perfectly perpendicular to the atomic jet, which is the case in the standard configuration of the atomic clock. In this case, the atoms may cross the laser beam without being subject to any significant change in polarization of the light, and the black states are not destroyed, or are only incompletely destroyed.

SUMMARY OF THE INVENTION

The present invention provides a novel solution for suppressing the black states produced by the optical pumping method by proposing an optical pumping method with which the polarization may be scrambled, and means for achieving it. This method has the advantage of its simplicity, as it does not resort to a stationary wave with zero angular momentum. Further, it does not depend on the selection and on the number of optical frequencies and does not require an intense magnetic field. Finally, it destroys the black states more effectively than the method of Shirley et al., because the particles pass through a larger polarization gradient.

More specifically, the invention relates to a method for optically pumping particles, consisting of having them transit from a long-lived level to another long-lived level, via a short-lived level, by interaction with light radiation emitted by a laser source, characterized in that said light radiation undergoes beforehand depolarization along a direction significantly perpendicular to its direction of propagation, so as to reduce the trapping of said particles in black states.

The invention also relates to a device for applying this method, including a particle-emitting source and at least one laser producing at least one polarized light radiation intended to perform optical pumping of said particles, characterized in that it further includes means for achieving depolarization of said radiation along a direction significantly perpendicular to its direction of propagation.

BRIEF DESCRIPTION OF THE DRAWING(S)

Other features of the invention will become more clearly apparent upon reading the following description, made with reference to the appended drawings, wherein:

FIG. 1 (Prior Art) schematically shows a representation of a particle having a level A, a level B and a level E.

DETAILED DESCRIPTION OF THE INVENTION

Figure 1:
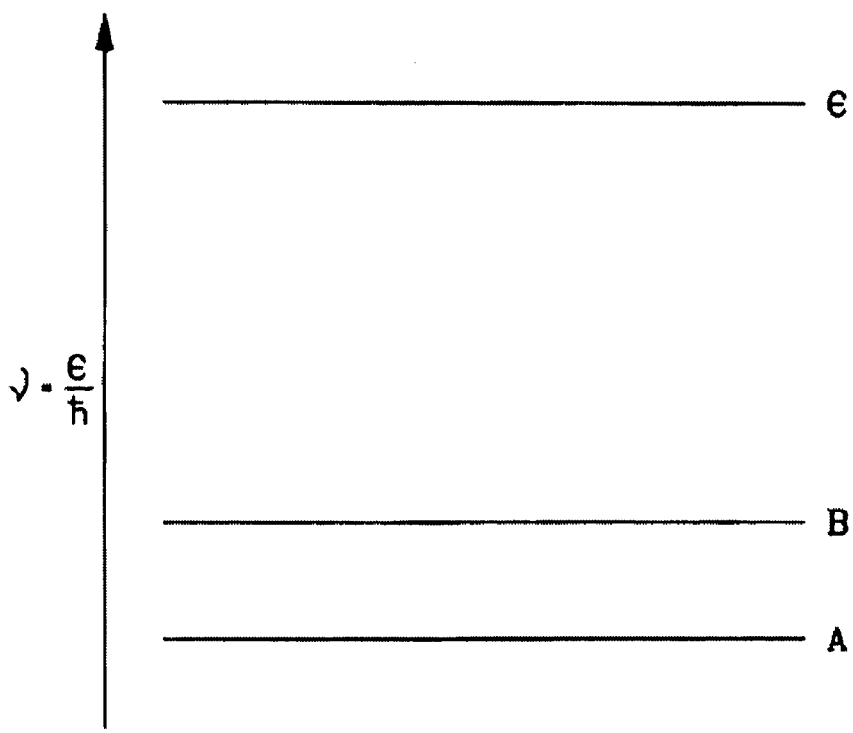
Figure 2:
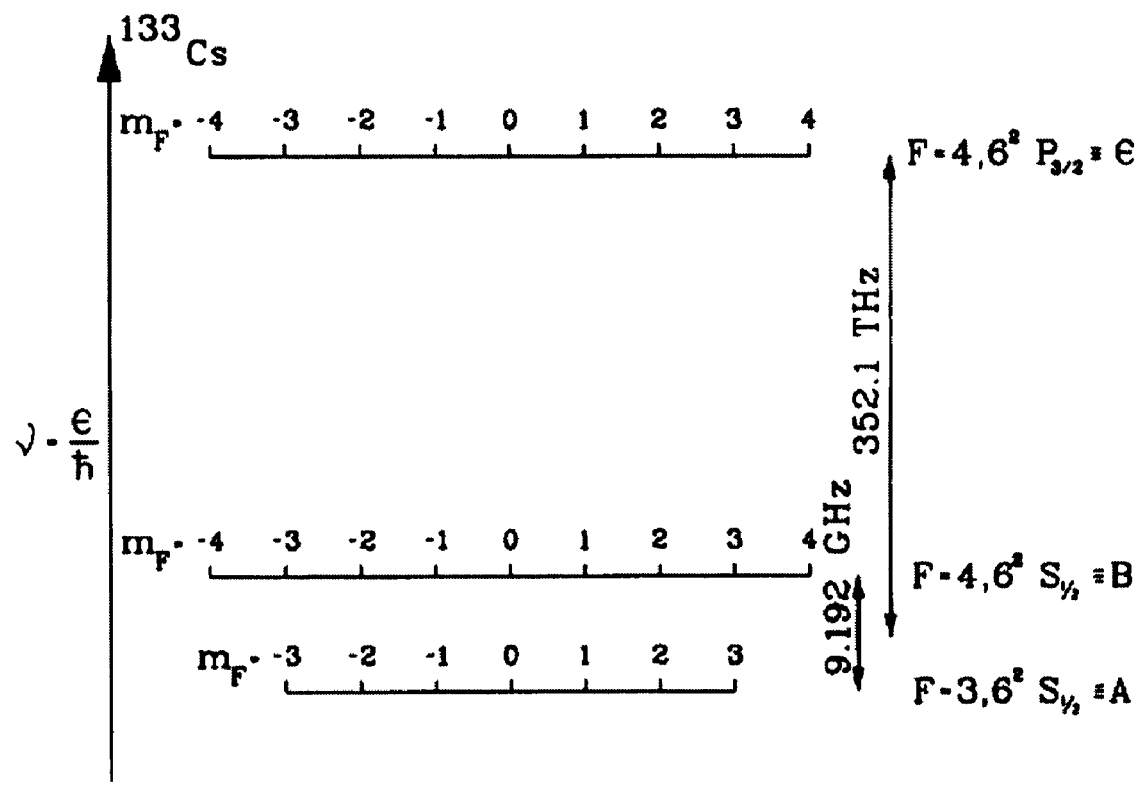
FIG. 2 (Prior Art) illustrates levels A, B and E in the case of a cesium atom $^{133}$Cs.
Figure 3:
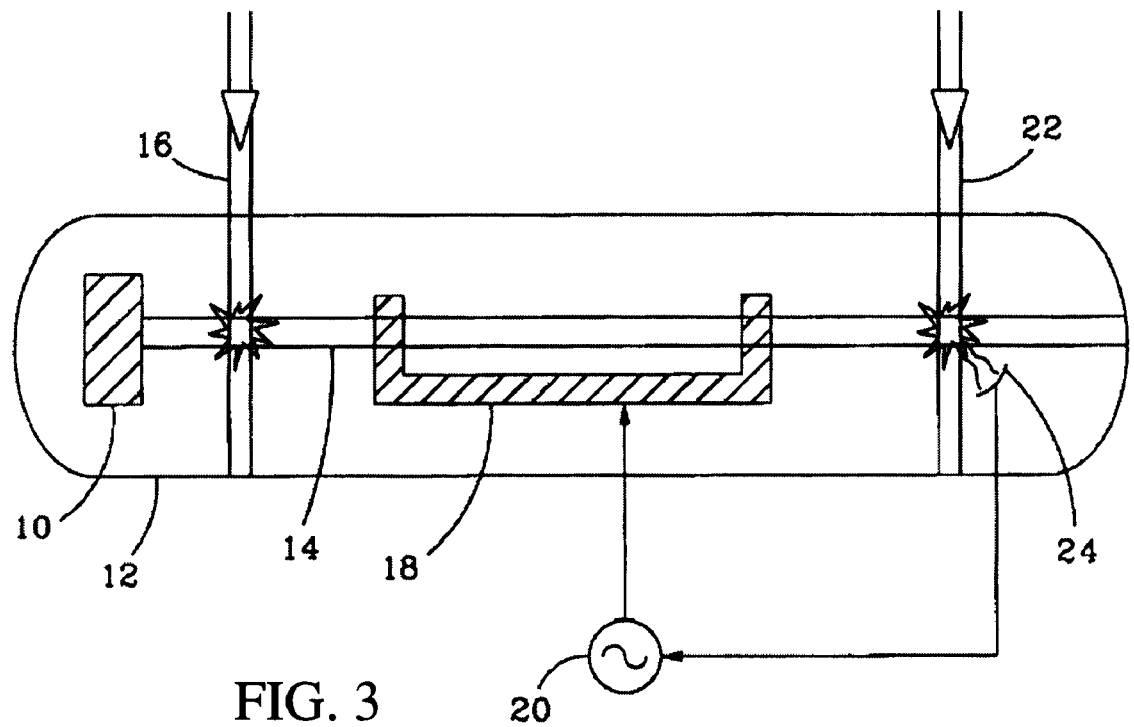
FIG. 3 (Prior Art) is a diagrammatic illustration of the basic structure of an atomic clock with an optically pumped cesium jet.
Figure 4:
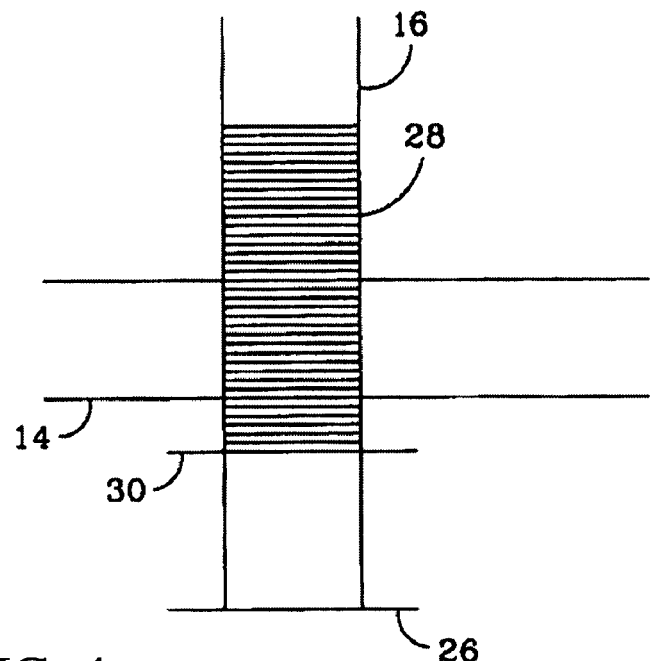
FIG. 4 (Prior Art) illustrates perturbing the polarization of the laser beam by creating an optical stationary wave having a polarization gradient substantially parallel to the direction of propagation.
Figure 5:
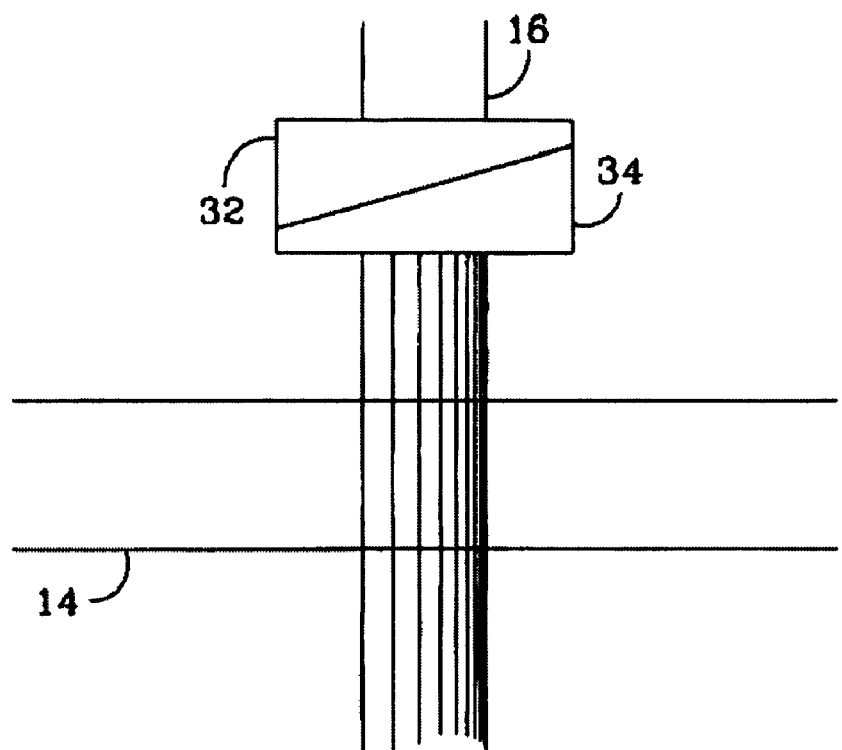
FIGS. 5 and 7 illustrate, in connection with FIGS. 1-4 already mentioned, two embodiments of optical pumping according to the invention.

FIG. 5 schematically illustrates the area for preparing the atomic jet in an enlarged view. The beam 16 crosses the atomic jet 14 in order to perform optical pumping. A birefringent plate 32, for example in crystalline quartz, with non-parallel faces, is inserted on the path of the beam 16, upstream from the atomic jet 14. The orientation of the optical axis of the plate 32 relatively to the polarization of the incident beam 16 is such that it creates a maximum of ellipticity of the output polarization, ideally of 45° between the axis of the incident linear polarization and the principle axes of the birefringent plate. The phase gradient accumulated by the incident plane wave 16 due to the change in thickness of the plate 32, combined with the ellipticity of the polarization due to the double refractive index of the birefringent plate 32, produces a polarization gradient of the light beam transverse to the direction of propagation of the light beam 16. Further, the orientation of the plane of symmetry of the plate 32 is such that the polarization gradient of the beam 16 is substantially parallel to the direction of the displacement of the particles.

As polarization thus varies continuously along the direction of atomic propagation, the atoms necessarily interact with a variable polarization on their path, leading to suppression of the black states.

It will be noted that the polarization gradient of the light beam introduced by the birefringent plate 32 is directly linked to its thickness gradient, to its birefringence and to the wavelength of the incident beam 16. In order to destroy the black states, the polarization must change significantly over the distance covered by the particle during one optical pumping cycle.

Moreover, the crystalline quartz plate 32 is advantageously associated with a compensation plate 34, neutral from the point of view of polarization, for example in amorphous silicon, which allows the deviation of the light beam 16 introduced by the plate 32 to be compensated.

Figure 6:
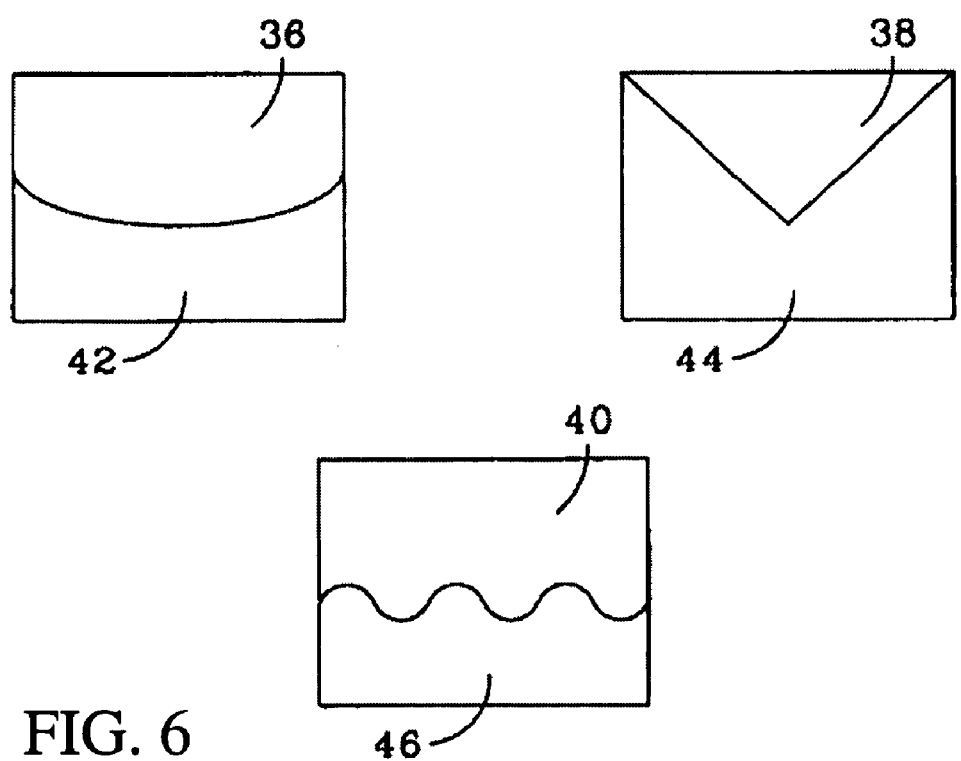
FIG. 6 illustrates alternatives of optical elements intended for this optical pumping.

The birefringent plate 32 with non-parallel faces is only an illustrative example of a device for scrambling the polarization according to the invention. Other optical components, illustrated in FIG. 6, have the required and sufficient characteristics for producing such scrambling, i.e., birefringence and change in thickness along an axis transverse to the light beam 16. These components are for example a lens 36, a cone of revolution 38, or a random surface plate 40. All are advantageously associated with a compensation component, 42, 44 and 46, respectively, of the type of the plate 34, intended to neutralize the effect of the component on the geometry of the beam 16. It will be noted that in the case of a component having axial symmetry of revolution (lens 36 and cone 38), the change in thickness and therefore the polarization gradient, occur in all the directions transverse to the direction of propagation of the light beam 16.

Unlike the birefringent plate 32 with non-parallel faces, these components 36, 38 and 40 with a transversely variable thickness, do not have a single plane of symmetry, but an axial or random symmetry of revolution. Their orientation relatively to the polarization of the incident beam 16 may be arbitrary.

Figure 7:
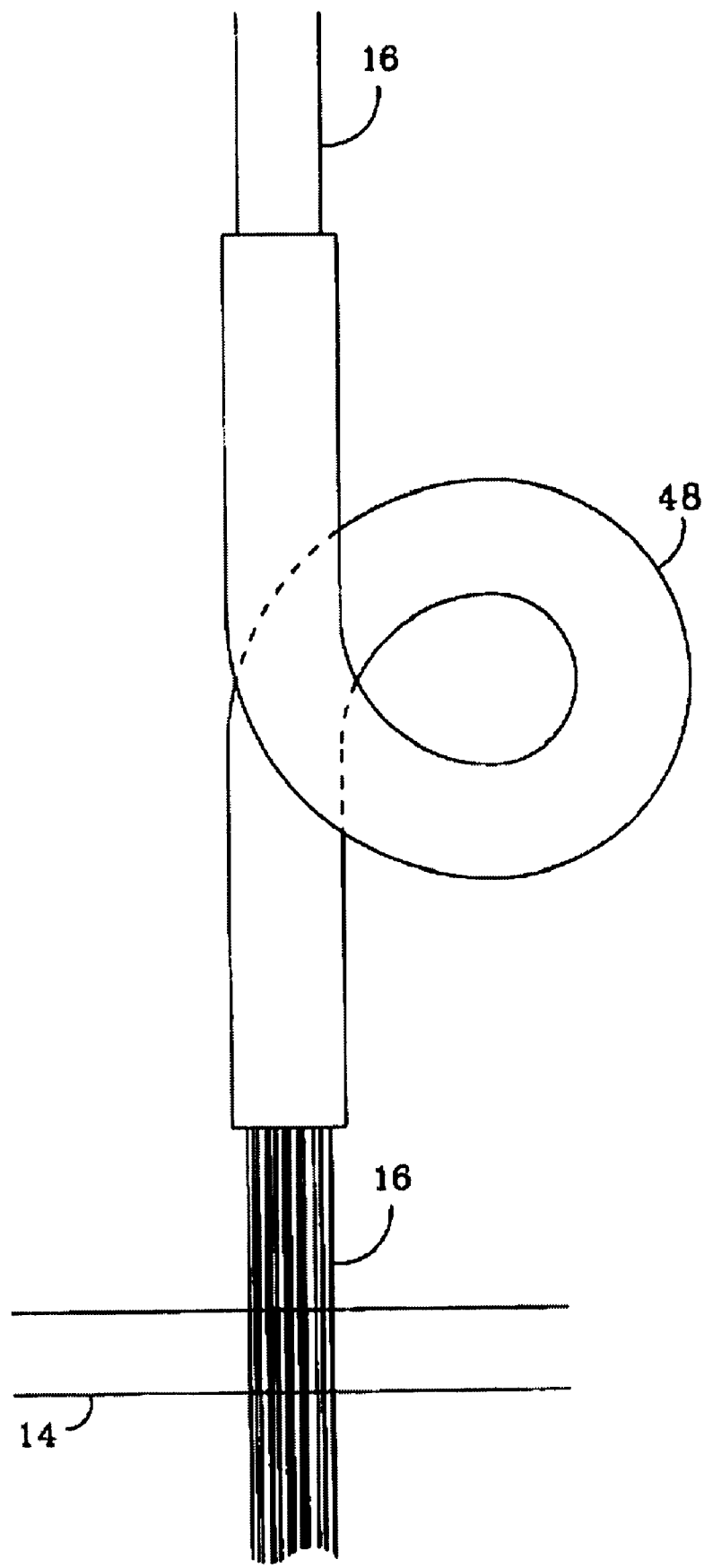

The scrambling method according to the invention may also be achieved by means of other optical components, as illustrated by FIG. 7. For producing this, a multimode optical fiber 48 is interposed on the path of the laser beam 16, upstream from the atomic jet 14; In this type of optical fiber, the polarization of the incident laser beam is not retained at the output of the fiber, because of the dispersion of the propagation velocity of the different modes of the fiber. This effect is all the more perceptible since the fiber 48 is long and mechanically stressed (a small radius of curvature) or thermally stressed (temperature gradient). The interference between the different polarization modes strongly depends on the transverse position in the beam exiting from the fiber. An advantageous solution consists of therefore winding the optical fiber 48 on itself in a sufficiently tightened way in order to have a sufficient mixture of polarizations at the output.

Moreover, integrated optics of the MOEMS (Mechanical Optical Electrical Micro-System) type is a future possibility. On this type of miniaturized device, the laser and the optics are associated on a same substrate. Scrambling of the polarization is obtained by means of components having a function identical with that of the birefringent plate or the optical fiber, and integrated on the substrate.

It will also be noted that the optical pumping according to the invention may be applied to the query area in the same way as to the preparation area.

Finally, the method is applicable to particles other than atoms, such as molecules, ions or aggregates of such particles, moving not only as a jet, but also as a cell.

The invention claimed is:

1. A method for optical pumping of particles, comprising: causing said particles to transit from a long-lived level to another long-lived level, via a short-lived level, by interaction with a light radiation emitted by a laser source, wherein said radiation undergoes beforehand depolarization along a direction essentially perpendicular to its direction of propagation, so as to reduce the trapping of said particles in a black state.

2. The optical pumping method according to claim 1, wherein said particles are emitted by a source substantially along a determined direction.

3. The optical pumping method according to claim 2, wherein said depolarization is substantially parallel to said direction of the particles.

4. The optical pumping method according to claim 1, wherein said depolarization is substantially a polarization gradient.

5. The optical pumping method according to claim 4, wherein said polarization gradient is achieved by means of a birefringent optical component with variable thickness, interposed on the path of said light radiation.

6. The optical pumping method according to claim 5, wherein said optical component of variable thickness is produced by means of a plate, the faces of which are non-parallel.

7. The optical pumping method according to claim 5, wherein said optical component of variable thickness is produced by means of a plate with axial symmetry of revolution.

8. The optical pumping method according to claim 5, wherein said optical component of variable thickness is in crystalline quartz.

9. The optical pumping method according to claim 1, wherein said depolarization is substantially a random mixture of polarizations.

10. The optical pumping method according to claim 9, wherein said mixture of polarizations is produced by means of a multimode optical fiber transporting said light radiation.

11. The optical pumping method according to claim 1, wherein said particles are atoms.

12. The optical pumping method according to claim 11, wherein said atoms are cesium atoms.

13. The optical pumping method according to claim 1, wherein said particles are molecules.

14. The optical pumping method according to claim 1, wherein said particles are ions.

15. The optical pumping method according to claim 1, wherein said particles are aggregates.

16. A device for optical pumping of particles, comprising a source for emitting particles, at least one laser for producing at least one polarized light radiation intended to perform optical pumping of said particles, and means for performing depolarization of said radiation along a direction essentially perpendicular to its direction of propagation, so as to reduce the trapping of said particles in a black state.

17. The device according to claim 16, further comprising a component providing a microwave cavity intended for having said particles pass from a long-lived level to another long-lived level, and a detector component, both of said components forming, together with said source and said laser, an atomic resonator.

18. The device according to claim 16, wherein said particles are emitted by said source substantially along a determined direction.

19. The device according to claim 18, wherein said depolarization is substantially parallel to said direction of the particles.

20. The device according to claim 16, wherein said means comprises a birefringent optical component having a variable thickness and interposed on the path of said light radiation.

21. The device according to claim 20, wherein said optical component with variable thickness is produced by means of a plate, the faces of which are non-parallel.

22. The device according to claim 21, wherein said optical component with variable thickness is produced by means of a plate with axial symmetry of revolution.

23. The device according to claim 20, wherein said optical component is in crystalline quartz.

24. The device according to claim 20, wherein said optical component is associated with a compensation plate, neutral from the point of view of polarization.

25. The device according to claim 16, wherein said means comprises a multimode optical fiber interposed on the path of said light radiation.

* * * * *